United States Patent
Kwak

(10) Patent No.: US 7,253,035 B2
(45) Date of Patent: Aug. 7, 2007

(54) THIN FILM TRANSISTOR ARRAY PANEL AND MANUFACTURING METHOD THEREOF

(75) Inventor: Sang-Ki Kwak, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 187 days.

(21) Appl. No.: 11/080,793

(22) Filed: Mar. 14, 2005

(65) Prior Publication Data

US 2006/0043365 A1    Mar. 2, 2006

(30) Foreign Application Priority Data

Aug. 24, 2004    (KR) .................. 10-2004-0066752

(51) Int. Cl.
*H01L 21/00*    (2006.01)

(52) U.S. Cl. .................. 438/149; 438/151; 257/59; 257/72; 257/E21.32

(58) Field of Classification Search ................ 438/149, 438/151, 128, 720, 754; 257/59, 72, E21.32
See application file for complete search history.

(56) References Cited

U.S. PATENT DOCUMENTS 7,005,670 B2 *    2/2006    Kim et al. ..................... 257/25
7,138,655 B2 *    11/2006    Tak et al. ..................... 257/59

* cited by examiner

*Primary Examiner*—Minh-Loan Tran

(57) ABSTRACT

A method of manufacturing a thin film transistor array panel is provided, which includes: forming a gate line on a substrate; forming a gate insulating layer; forming a semiconductor layer; forming a lower data line; forming an upper data line including a source electrode and a drain electrode, the upper data line including a portion disposed on the semiconductor layer without interposing the lower data line; forming a passivation layer having a first contact hole exposing the drain electrode at least in part; and forming a pixel electrode on the first contact hole to contact the drain electrode.

14 Claims, 16 Drawing Sheets

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof.

(b) Description of the Related Art

A liquid crystal display (LCD) is one of the most widely used flat panel displays since it is lightweight and occupies less space than conventional cathode ray tube (CRT) displays. An LCD generally includes a liquid crystal (LC) layer that is interposed between a pair of panels including field-generating electrodes such as pixel electrodes and a common electrode. The LC layer is subjected to an electric field generated by the field-generating electrodes and variations in the field strength change the molecular orientation of the LC layer. For example, upon application of an electric field, the molecules of the LC layer change their orientation to change polarization of incident light. Appropriately arranged polarizers partially or fully block the light, creating gray or dark areas that can represent desired images.

One panel for the LCD generally includes a plurality of pixel electrodes, a plurality of thin film transistors (TFTs) for controlling signals to be applied to the pixel electrodes, a plurality of gate lines transmitting control signals for controlling the TFTs, and a plurality of data lines transmitting data voltages to be supplied to the pixel electrodes. The TFTs include gate electrodes connected to the gate lines, source electrodes connected to the data lines, and drain electrodes connected to the pixel electrodes. The other panel generally includes a common electrode disposed on an entire surface thereof.

The TFT array panel including the TFTs includes several conductive films and insulting films. The gate lines, the data lines, and the pixel electrodes are formed of different films and they are separated by insulating films and sequentially arranged from bottom to top. The gate electrodes of the TFTs are branches or portions of the gate lines, the source electrodes are branches or portions of the data lines, and the drain electrodes are usually made of the same films as the data lines.

The gate lines and the data lines are preferably made of low resistivity material such as aluminum (Al) containing metal (e.g. Al or Al alloy) in order to minimize signal delay or voltage drop. However, Al containing metal cannot form a contact with semiconductor doped with impurity and thus Al containing metal is usually used in the data lines and the drain electrodes along with another metal having good contact characteristics with semiconductor and materials such as transparent conductive materials.

In a bottom gate thin film transistor, good contact material is usually disposed under Al containing metal since the data lines and the drain electrodes are disposed on the semiconductor. However, since Al containing metal has poor contact characteristics with transparent conductive material such as indium tin oxide (ITO) or indium zinc oxide (IZO) such that the contact resistance thereof is large and Al containing metal are corroded at the contacts. Therefore, the surface of Al containing metal of the drain electrodes must be etched to expose the good contact material for contact with the pixel electrodes usually made of ITO or IZO.

Since the multi-layered structure of the data lines and the drain electrodes is usually patterned by a lithography step, the data lines and the drain electrodes may be often disconnected. In addition, the removal of Al containing metal at the contacts may generate undercut that causes the disconnection of the pixel electrodes at the contacts.

SUMMARY OF THE INVENTION

A motivation of the present invention is to solve the problems of the conventional art.

A method of manufacturing a thin film transistor array panel is provided, which includes: forming a gate line on a substrate; forming a gate insulating layer; forming a semiconductor layer; forming a lower data line; forming an upper data line including a source electrode and a drain electrode, the upper data line including a portion disposed on the semiconductor layer without interposing the lower data line; forming a passivation layer having a first contact hole exposing the drain electrode at least in part; and forming a pixel electrode on the first contact hole to contact the drain electrode.

The upper data line may have a contact characteristic with the pixel electrode better than the lower data line.

The lower data line may include Al or Al alloy, the upper data line may include Cr, Mo, or Mo alloy, and the pixel electrode may include ITO or IZO.

The upper data line may cap the lower data line. Moreover, the source electrode is formed by the upper data line only.

The drain electrode may include the same layer as the upper data line.

The method may further include: forming an ohmic contact layer on the semiconductor layer.

The formation of the gate insulating layer, the formation of the semiconductor layer, the formation of the ohmic contact layer, and the formation of the lower data line may include: depositing the gate insulating layer, the semiconductor layer, the ohmic contact layer, and a lower conductive film in sequence; forming a first photoresist on the lower conductive film; sequentially etching the lower conductive film, the ohmic contact layer, and the semiconductor layer using the first photoresist as an etch mask; deforming the first photoresist to form a second photoresist; and etching the lower conductive film to form the lower data line.

The first photoresist may have a position-dependent thickness.

The first photoresist may be formed by using a mask having a transparent area, an opaque area, and a translucent area.

The deformation of the first photoresist may include ashing the first photoresist.

The ashing of the first photoresist may include: removing a portion of the first photoresist corresponding to the translucent area of the mask.

The method may further include: forming a second contact hole at the passivation layer or the gate insulating layer exposing a portion of the gate line or the data line; and forming a contact assistant on the second contact hole to contact the exposed portion of the gate line or the data line.

A thin film transistor array panel is provided, which includes: a gate line; a first insulator disposed on the gate line; a semiconductor disposed on the first insulator; an ohmic contact disposed on the semiconductor; a first conductor layer disposed on the ohmic contact; a second conductor layer including a first portion disposed on the first conductor layer and a second portion contacting the ohmic contact; a second insulating layer disposed on the second conductor layer and having a contact hole exposing the second conductor layer at least in part; and a pixel electrode disposed on the second insulating layer and contacting the second conductor layer through the contact hole.

The second conductor layer may fully cover the first conductor layer.

The second conductor layer may include a source electrode and a drain electrode separated from each other.

The semiconductor may include a channel portion disposed between the source electrode and the drain electrode and the ohmic contact has substantially the same planar shape as the semiconductor except for the channel portion.

The second conductor layer may have a contact characteristic with the pixel electrode better than the first conductor layer.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
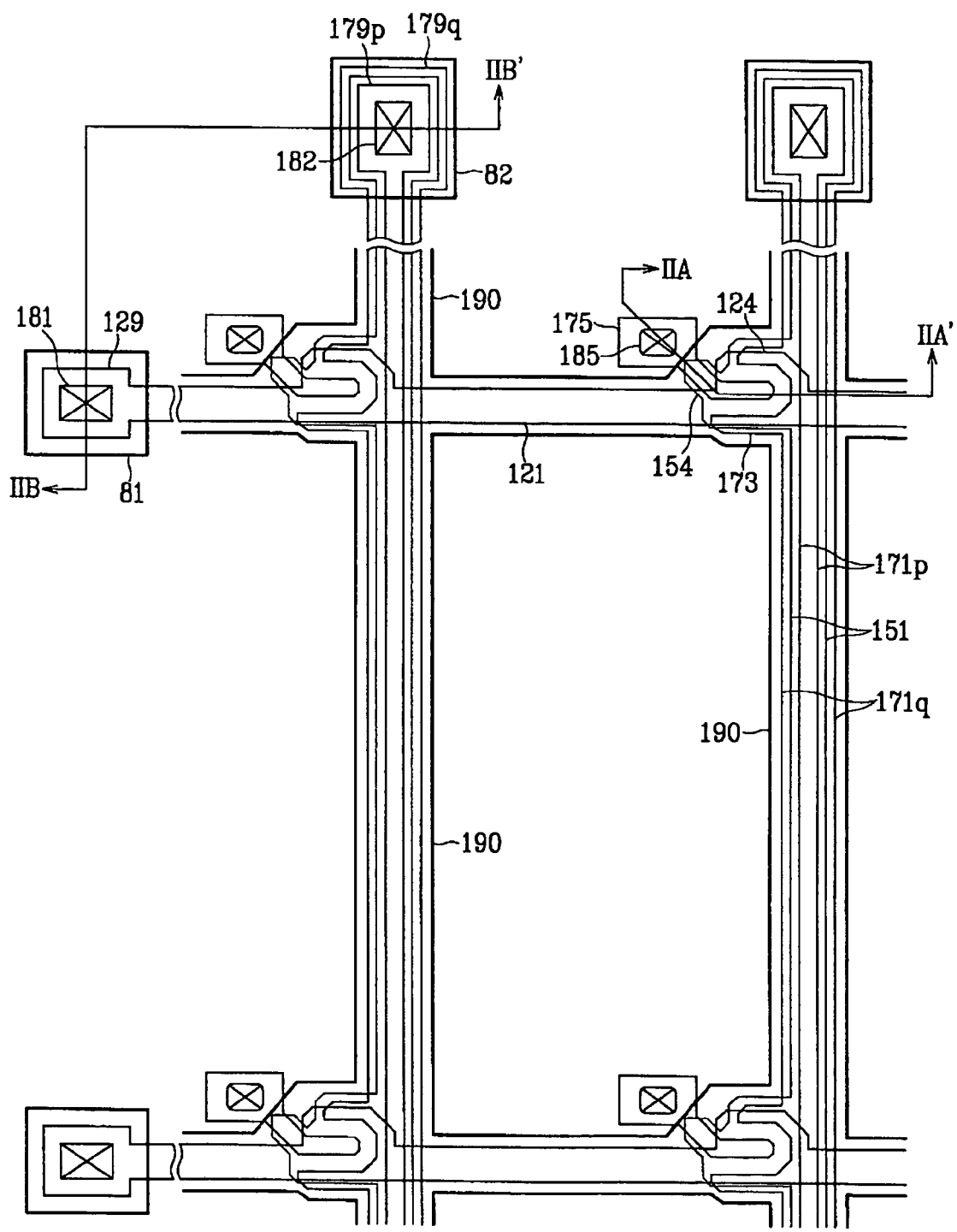
FIG. 1 is a layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1, 2A and 2B.

Figure 2A:
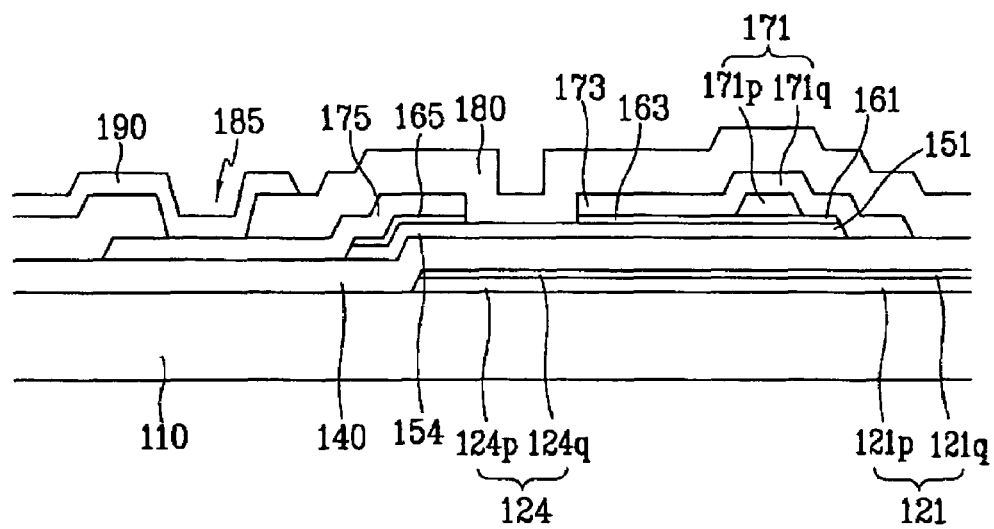
FIGS. 2A and 2B are sectional views of the TFT array panel shown in FIG. 1 taken along the lines IIa-IIa' and IIb-IIb', respectively.
Figure 2B:
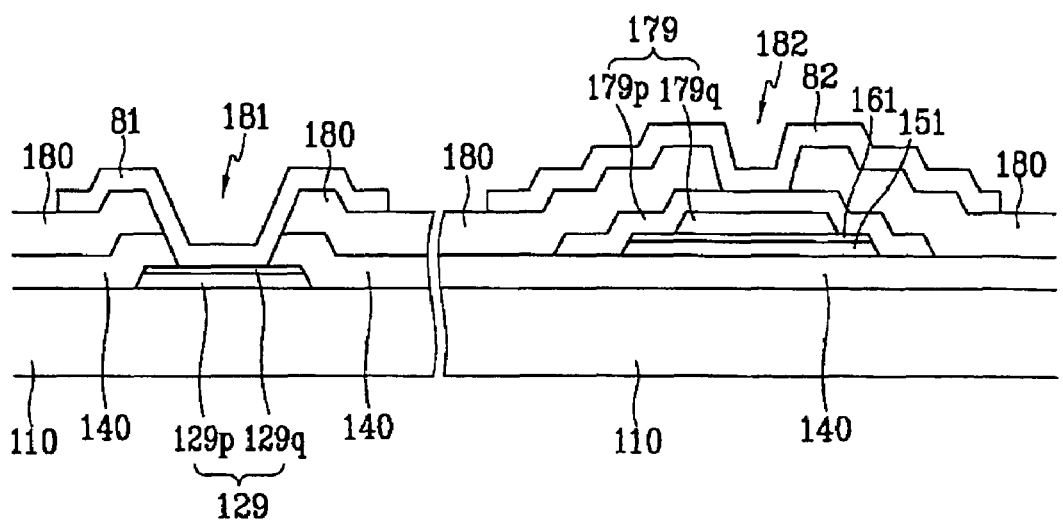

FIG. 1 is a layout view of a TFT array panel according to an embodiment of the present invention, and FIGS. 2A and 2B are sectional views of the TFT array panel shown in FIG. 1 taken along the lines IIa-IIa' and IIb-IIb', respectively.

A plurality of gate lines 121 for transmitting gate signals are formed on an insulating substrate 110. Each gate line 121 extends substantially in a transverse direction and it includes a plurality of portions projecting upward to form a plurality of gate electrodes 124 and an end portion 129 having a large area for contact with another layer or an external device.

The gate lines 121 include two films having different physical characteristics, a lower film 121p and an upper film 121q. The lower film 121p is preferably made of low resistivity metal including Al containing metal such as Al and Al alloy, Ag containing metal such as Ag and Ag alloy, Cu containing metal such as Cu and Cu alloy for reducing signal delay or voltage drop in the gate lines 121. On the other hand, the upper film 121q is preferably made of material such as Mo containing metal such as Mo or Mo alloy, Cr, Ta and Ti, which has good physical, chemical, and electrical contact characteristics with other transparent conductive materials such as (amorphous) indium tin oxide (ITO) and indium zinc oxide (IZO). Good examples of combination of the lower film material and the upper film material are Al (or Al—Nd) and Cr and Al (or Al—Nd) and Mo containing metal. In FIGS. 2A and 2B, the lower and the upper films of the gate electrodes 124 are indicated by reference numerals 124p and 124q, respectively, and the lower and the upper films of the end portions 129 are indicated by reference numerals 129p and 129q, respectively.

Alternately, the gate lines 121 may include a good contact lower film such as Cr or Mo and a low resistivity upper film such as Al containing metal, and in this case, portions of the upper film 129q of the end portions 129 of the gate lines 121 are preferably removed to expose the underlying portions of the lower films 129p and thus there is at least an edge of the upper film 129q disposed on the lower film 129p.

Otherwise, the gate lines 121 may include a single layer or triple or more layers of conductive films.

The lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") or polysilicon are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30-80 degrees.

A plurality of data lines 171 and a plurality of drain electrodes 175 are formed on the ohmic contacts 161 and 165.

The data lines 171 for transmitting data voltages extend substantially in the longitudinal direction and intersect the gate lines 121. Each data line 171 includes an end portion 179 having a larger area for contact with another layer or an external device.

A plurality of branches of each data line 171, which project toward the drain electrodes 175, form a plurality of source electrodes 173. Each drain electrode 175 includes a linear end portion disposed on a gate electrode 124 and partially enclosed by a source electrode 173 and an expanded end portion having a large area for contact with another layer. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

Each data line 171 includes a lower data line 171p of low resistivity metal and an upper data line 171q of good contact characteristics. The planar shape of the lower data line 171p is somewhat different from that of the upper data line 171q. Referring to FIG. 1, the upper data line 171q is wider than the lower data line 171p such that the upper film 171p fully covers or caps the lower data line 171p. However, the source electrodes 173 and/or the drain electrodes 175 may include a single film made of the same layer as the upper data line 171q.

Good examples of the lower film material are Al (or Al—Nd). Good examples of the upper film material are Mo containing metal and Cr. In FIGS. 2A and 2B, the lower and the upper films of the end portions 179 are indicated by reference numerals 179p and 179q, respectively.

The data lines 171 may include a lower Mo containing metal film, a middle Al containing film, and an upper Mo containing film.

Like the gate lines 121, the data lines 171 and the drain electrodes 175 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and the exposed portions of the semiconductor stripes 151, which are not covered with the data lines 171 and the drain electrodes 175. The passivation layer 180 is preferably made of inorganic material such as silicon nitride and silicon oxide, photosensitive organic material having a good flatness characteristic, or low dielectric insulating material such as a-Si:C:O and a-Si:O:F formed by plasma enhanced chemical vapor deposition (PECVD).

The passivation layer 180 has a plurality of contact holes 182 and 185 exposing the end portions 179 of the data lines 171 and the expanded end portions of the drain electrodes 175, respectively. The passivation layer 180 and the gate insulating layer 140 have a plurality of contact holes 181 exposing the end portions 129 of the gate lines 121.

A plurality of pixel electrodes 190 and a plurality of contact assistants 81 and 82, which are preferably made of ITO, amorphous ITO (a-ITO), or IZO, are formed on the passivation layer 180.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with a common electrode (not shown) on another panel (not shown), which determine orientations of liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, may be provided for enhancing the voltage storing capacity. The storage capacitors are implemented by overlapping the pixel electrodes 190 with the gate lines 121 adjacent thereto (called "previous gate lines") or with separately provided storage electrodes (not shown). The capacitances of the storage capacitors, i.e., the storage capacitances are increased by increasing overlapping areas or by providing conductors, which are connected to the pixel electrodes 190 and overlap the gate lines 121 or the storage electrodes, under the pixel electrodes 190 for decreasing the distance between the terminals.

The pixel electrodes 190 may overlap the gate lines 121 and the data lines 171 to increase aperture ratio.

The contact assistants 81/82 are connected to the exposed end portions 129/179 of the gate lines 121/data lines 171 through the contact holes 181/182. The contact assistants 81 and 82 protect the exposed portions 129 and 179 and complement the adhesion between the exposed portions 129 and 179 and external devices.

In the meantime, the gate lines 121 and the data lines 171 may be directly connected to a gate driver and a data driver respectively when the gate driver/data drivers are integrated on the substrate 110. In this case, the contact assistants 81/82 may be used for connecting the gate lines 121 and data lines 171 to the output terminals of the respective gate/data drivers.

The pixel electrodes 190 may be made of transparent conductive polymer. For a reflective LCD, the pixel electrodes 190 are made of opaque reflective metal. In these cases, the contact assistants 81 and 82 may be made of material such as ITO or IZO different from the pixel electrodes 190.

A method of manufacturing the TFT array panel shown in FIGS. 1, 2A and 2B according to an embodiment of the present invention will be now described in detail with reference to FIGS. 3 to 15B as well as FIGS. 1, 2A and 2B.

Figure 3:
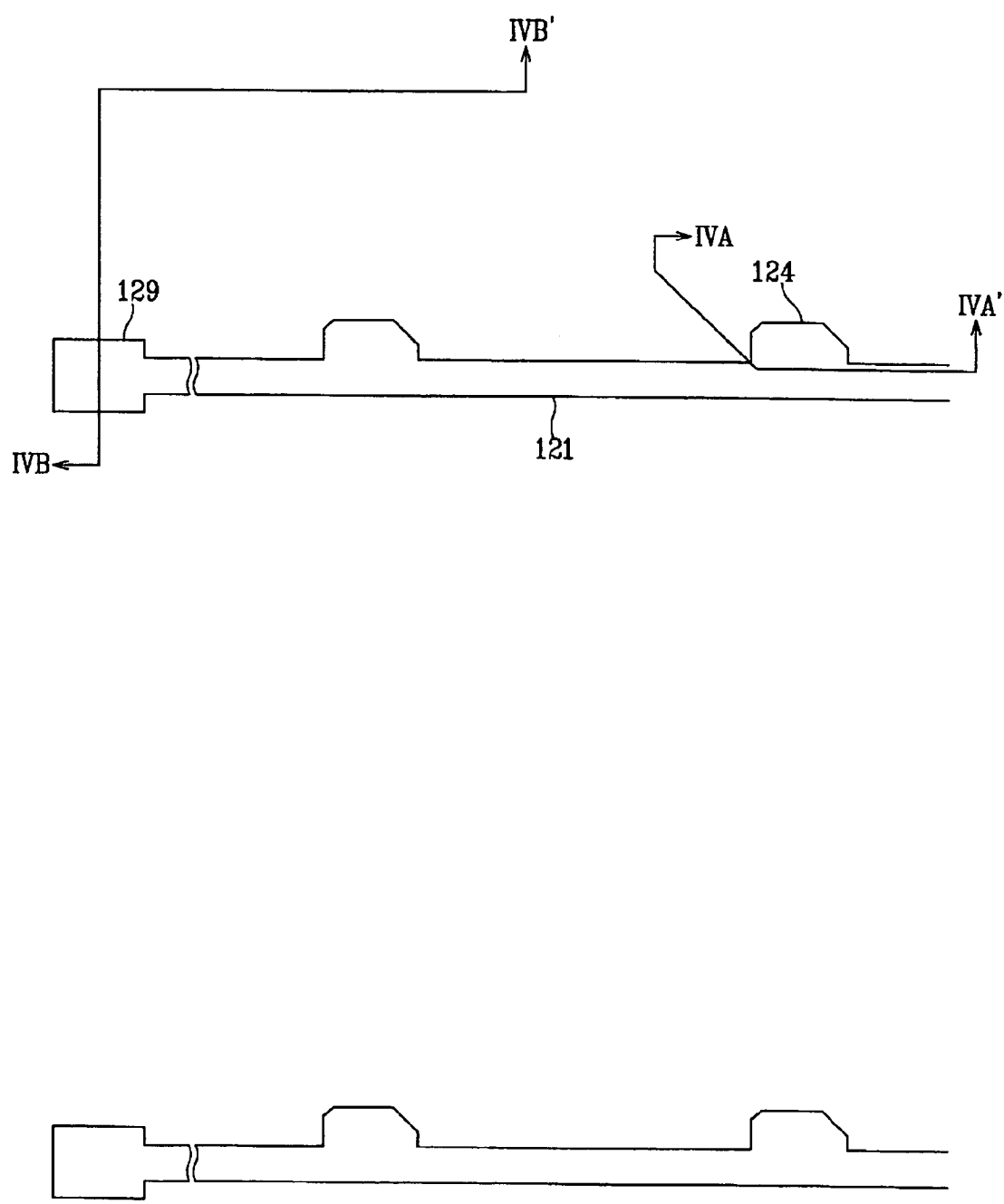
FIG. 3 is a layout view of a TFT array panel shown in FIGS. 1, 2A and 2B in the first step of a manufacturing method thereof according to an embodiment of the present invention.
Figure 4A:
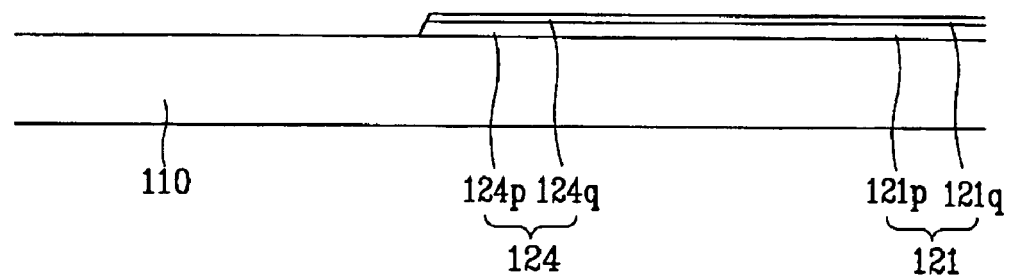
FIGS. 4A and 4B are sectional views of the TFT array panel shown in FIG. 3 taken along the lines IVa-IVa' and IVb-IVb', respectively.
Figure 4B:
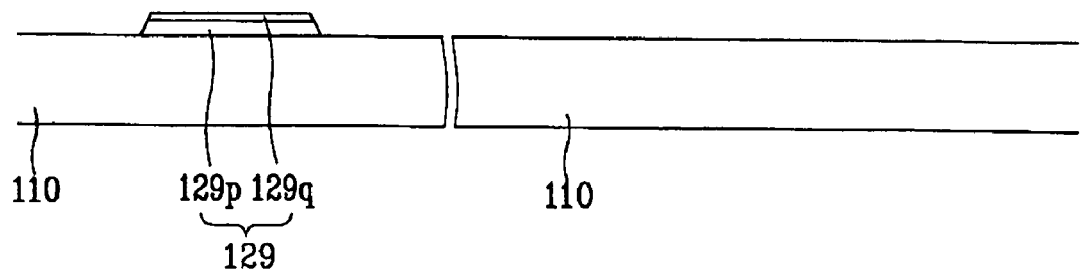
Figure 5A:
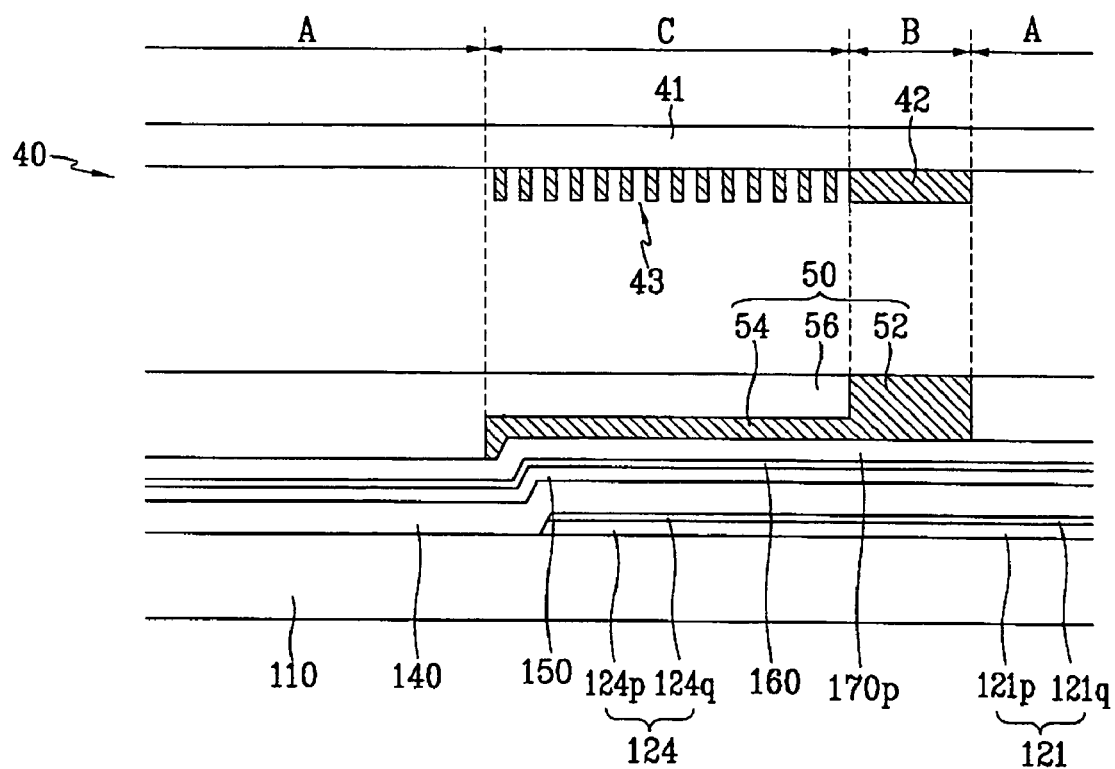
FIGS. 5A and 5B are sectional views of the TFT array panel shown in FIG. 3 taken along the lines IVa-IVa' and IVb-IVb', respectively, and illustrate the step following the step shown in FIGS. 4A and 4B.
Figure 5B:
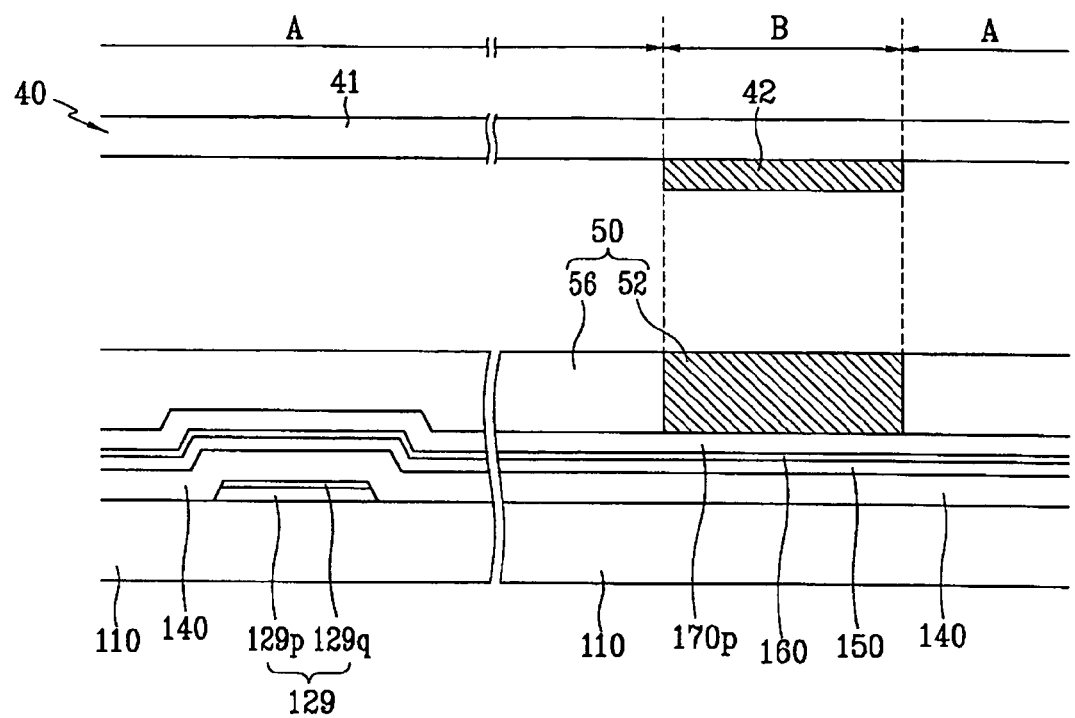
Figure 6:
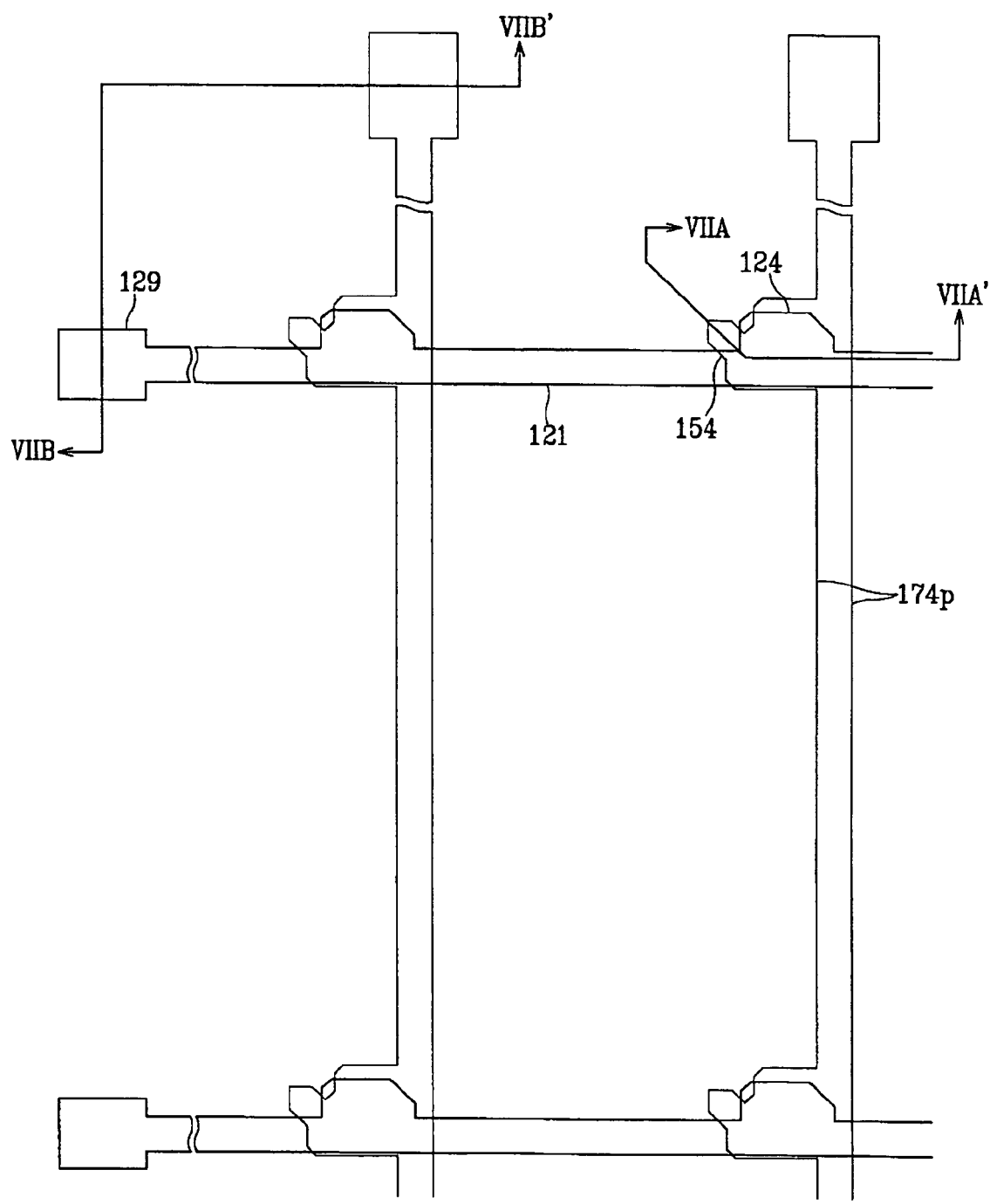
FIG. 6 is a layout view of the TFT array panel in the step following the step shown in FIGS. 5A and 5B.
Figure 7A:
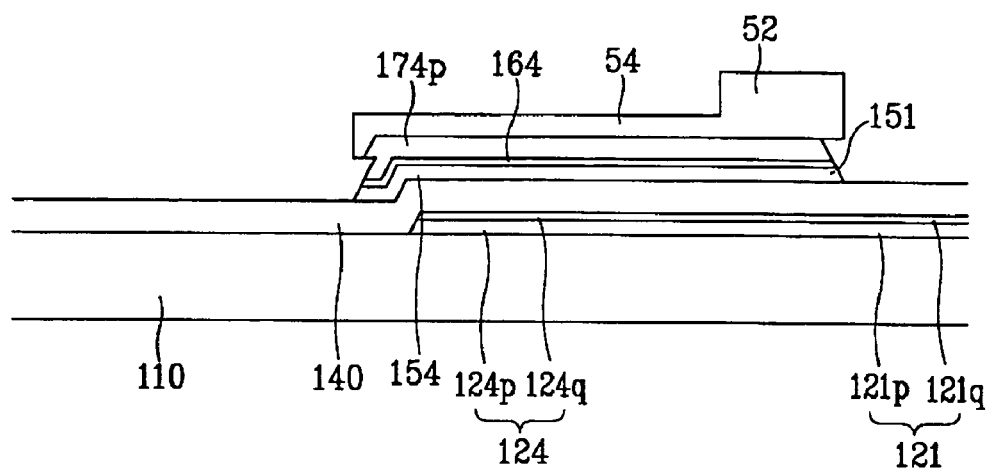
FIGS. 7A and 7B are sectional views of the TFT array panel shown in FIG. 6 taken along the lines VIIa-VIIa' and VIIb-VIIb', respectively.
Figure 7B:
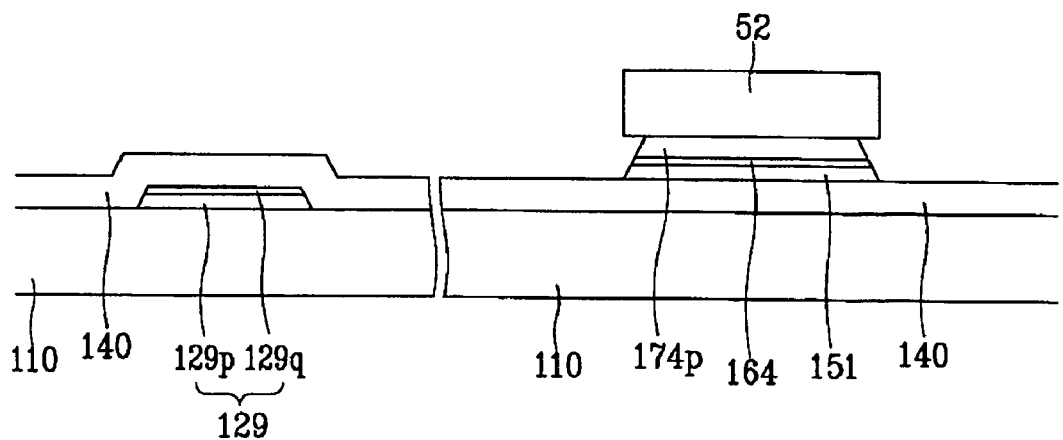
Figure 8A:
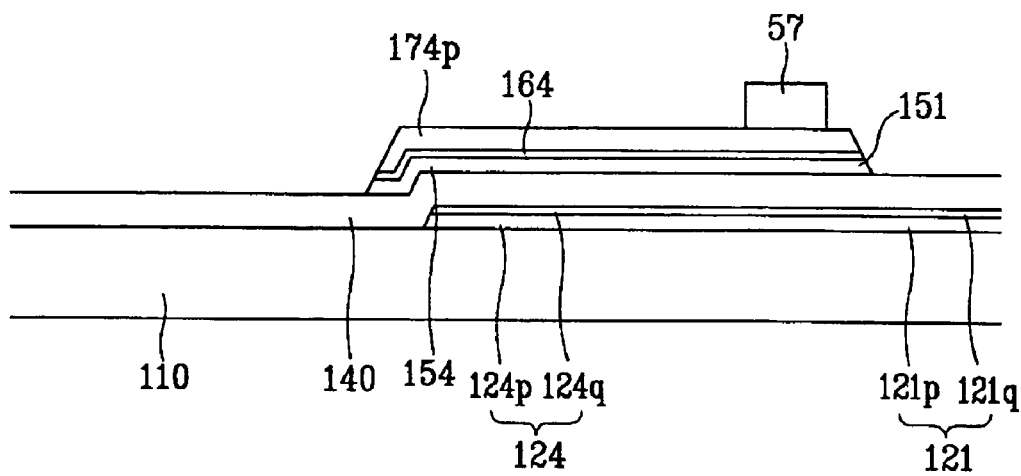
FIGS. 8A and 8B are sectional views of the TFT array panel shown in FIG. 6 taken along the lines VIIa-VIIa' and VIIb-VIIb', respectively, and illustrate the step following the step shown in FIGS. 7A and 7B.
Figure 8B:
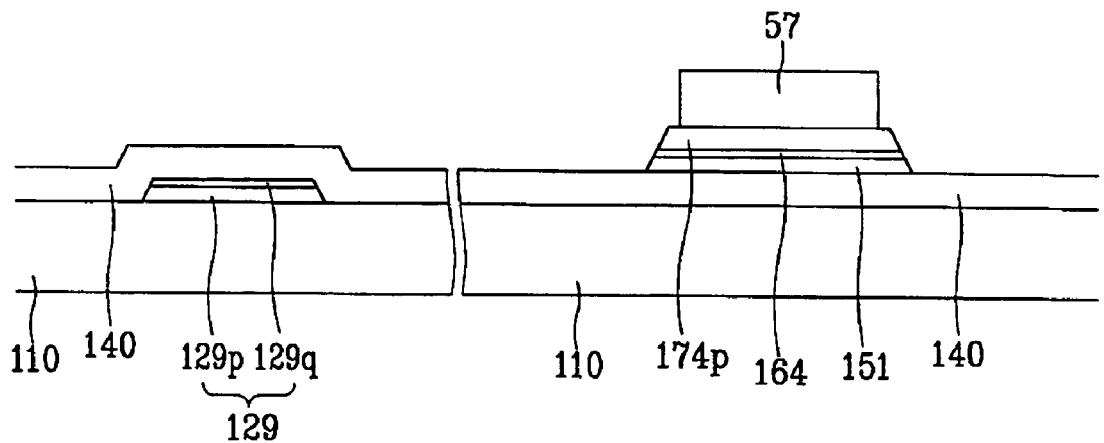
Figure 9:
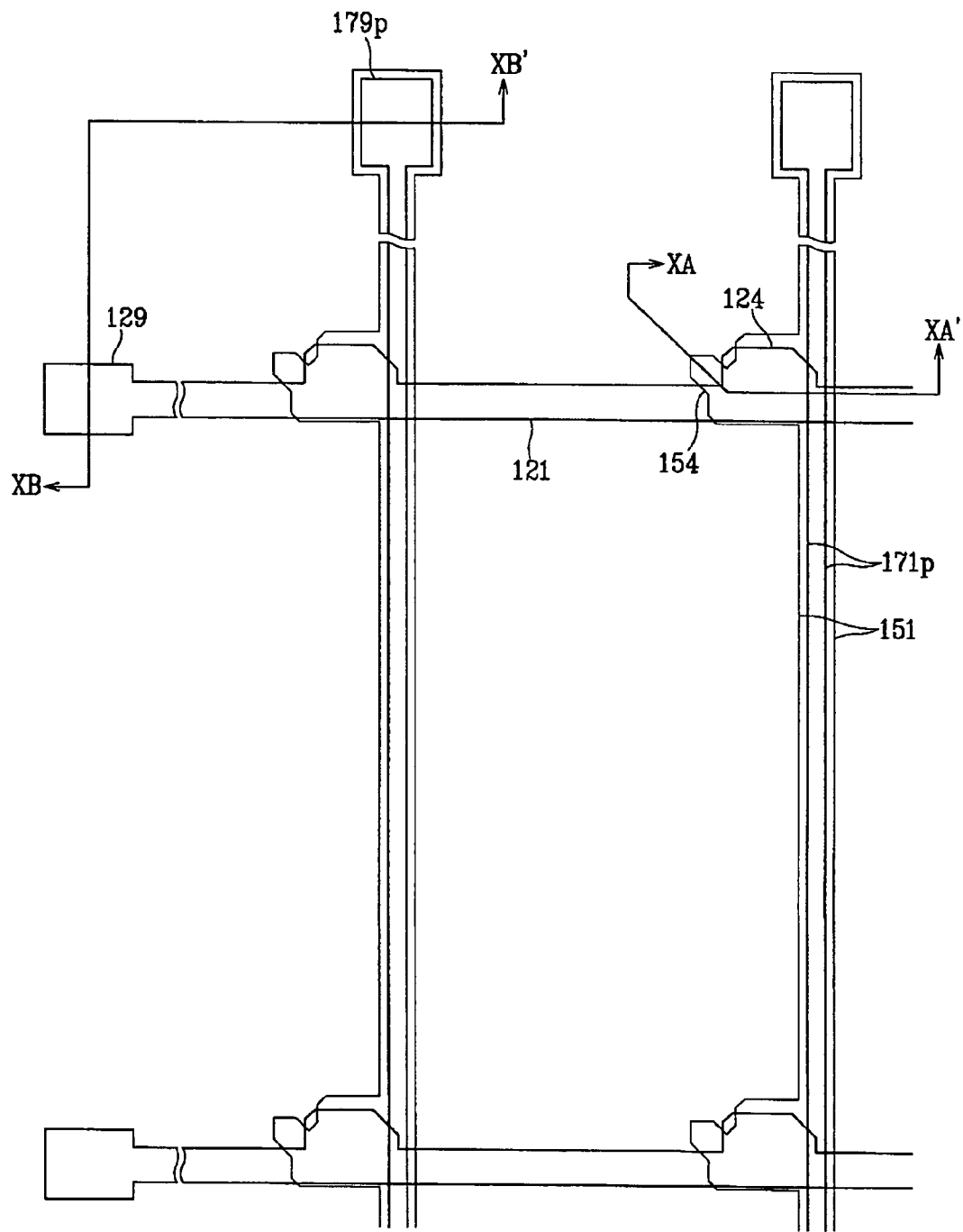
FIG. 9 is a layout view of the TFT array panel in the step following the step shown in FIGS. 8A and 8B.
Figure 10A:
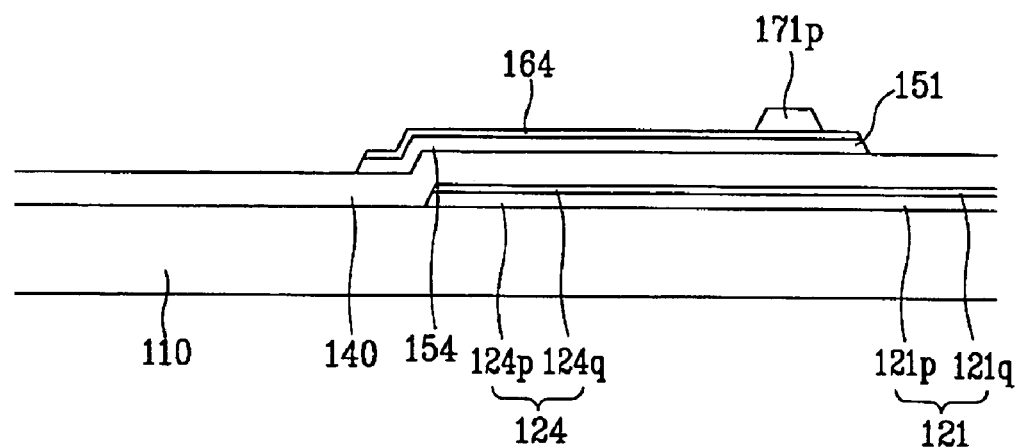
FIGS. 10A and 10B are sectional views of the TFT array panel shown in FIG. 9 taken along the lines Xa-Xa' and Xb-Xb', respectively.
Figure 10B:
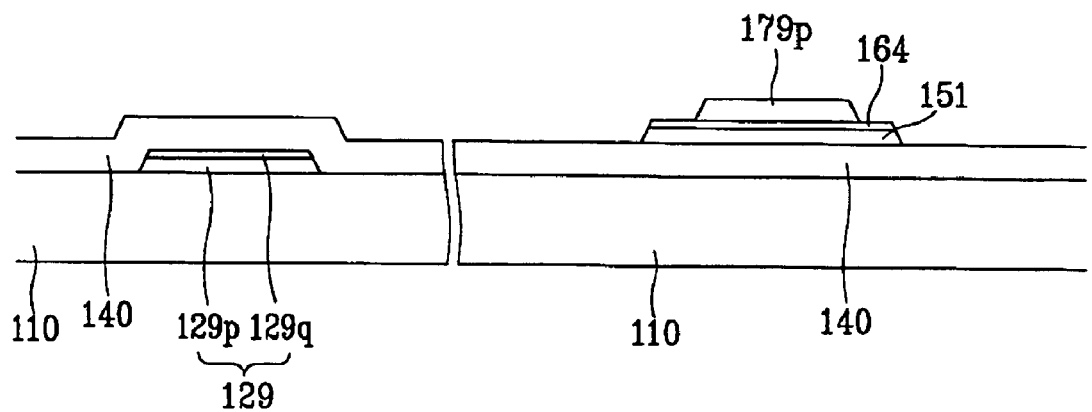
Figure 11A:
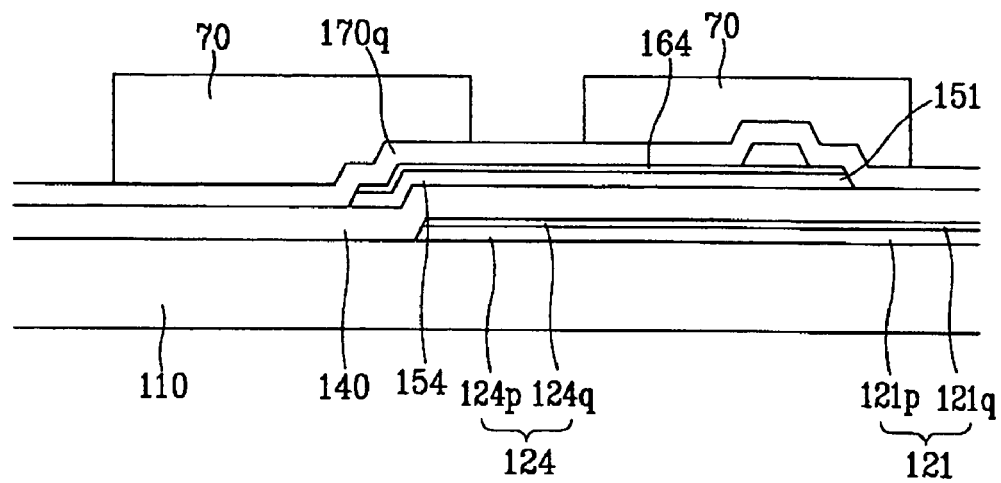
FIGS. 11A and 11B are sectional views of the TFT array panel shown in FIG. 9 taken along the lines Xa-Xa' and Xb-Xb', respectively, and illustrate the step following the step shown in FIGS. 10A and 10B.
Figure 11B:
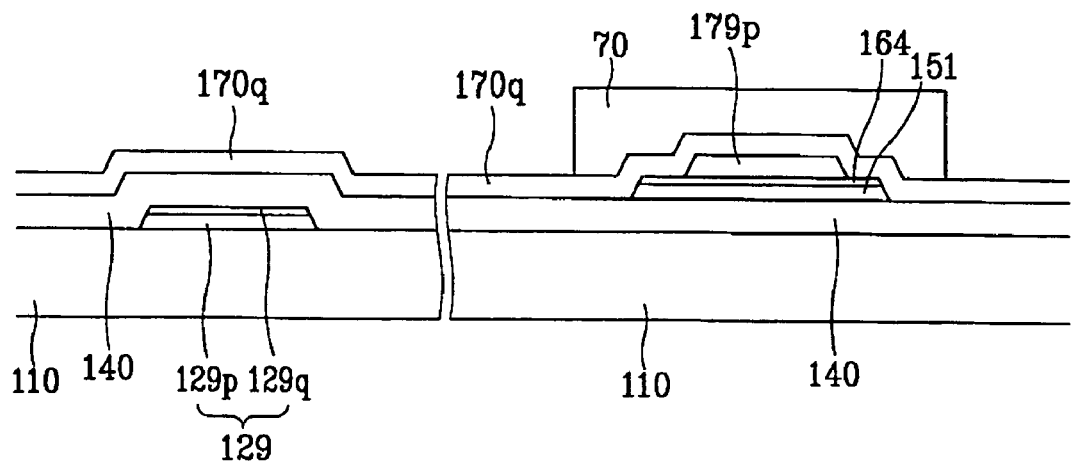
Figure 12:
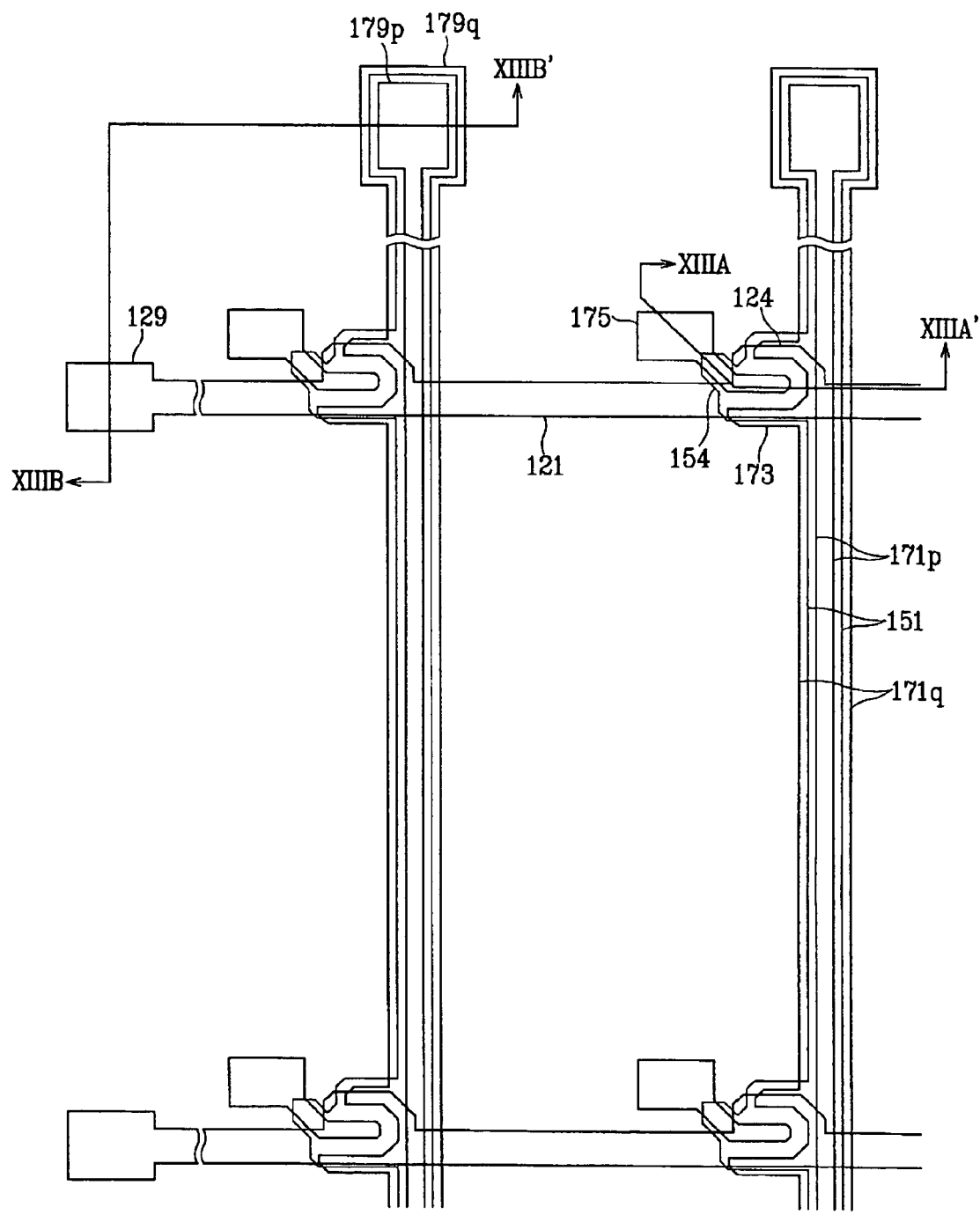
FIG. 12 is a layout view of the TFT array panel in the step following the step shown in FIGS. 11A and 11B.
Figure 13A:
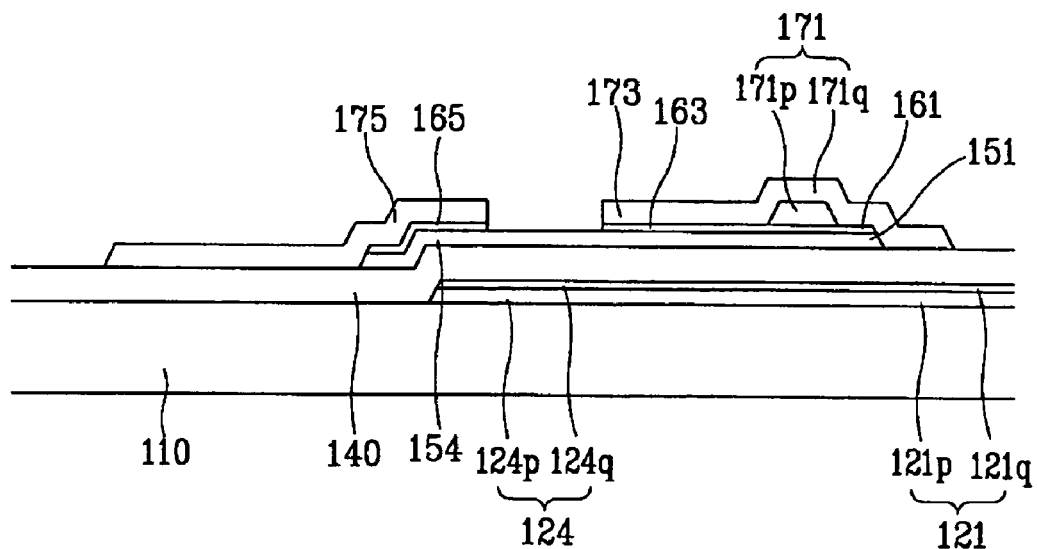
FIGS. 13A and 13B are sectional views of the TFT array panel shown in FIG. 12 taken along the lines XIIIa-XIIIa' and XIIIb-XIIIb', respectively.
Figure 13B:
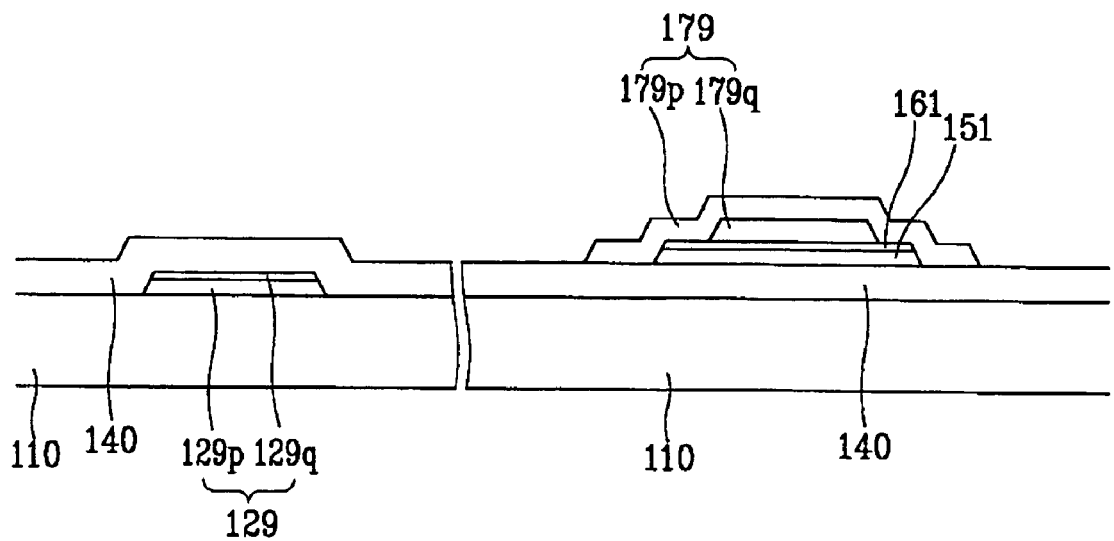
Figure 14:
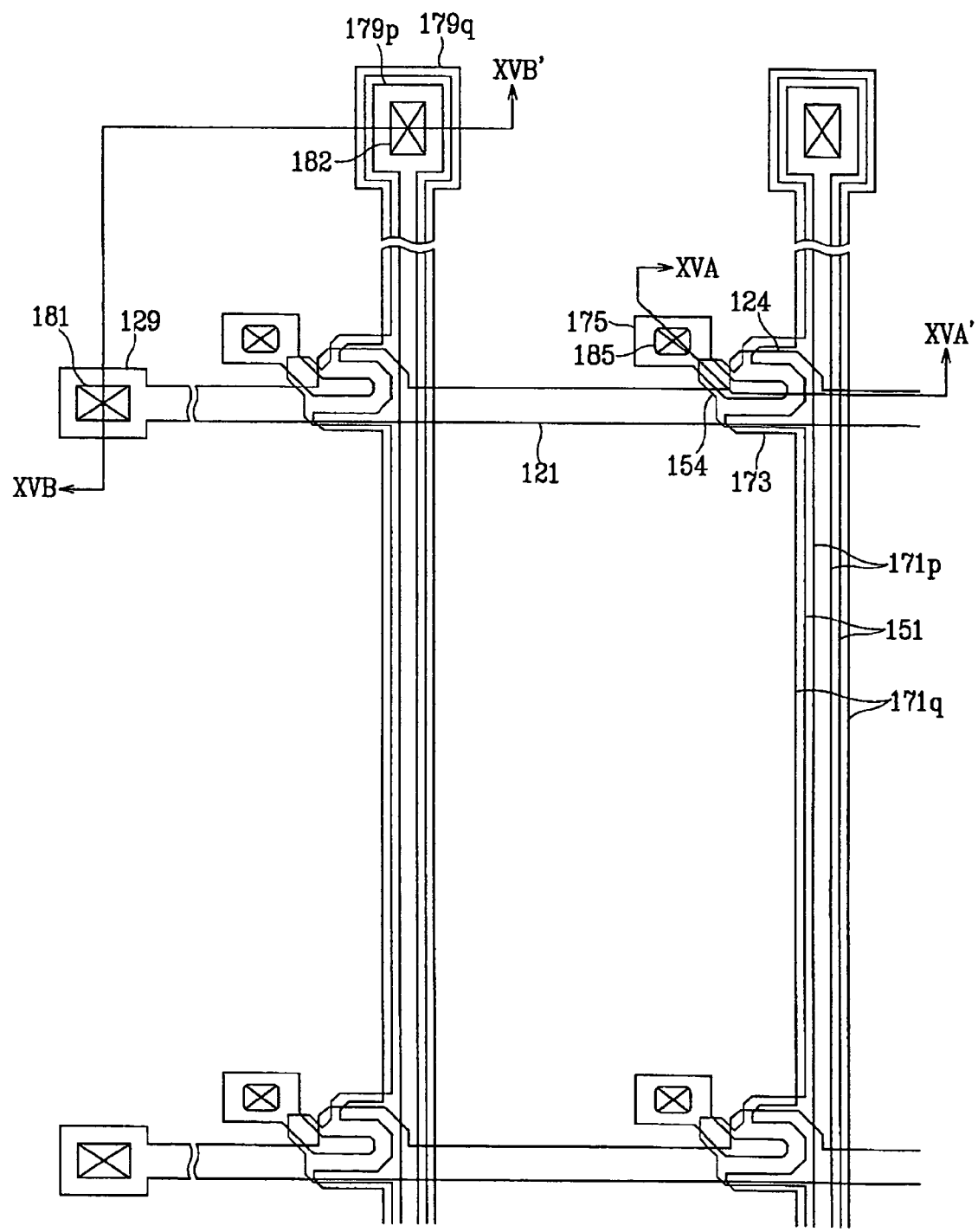
FIG. 14 is a layout view of the TFT array panel in the step following the step shown in FIGS. 12, 13A and 13B.
Figure 15A:
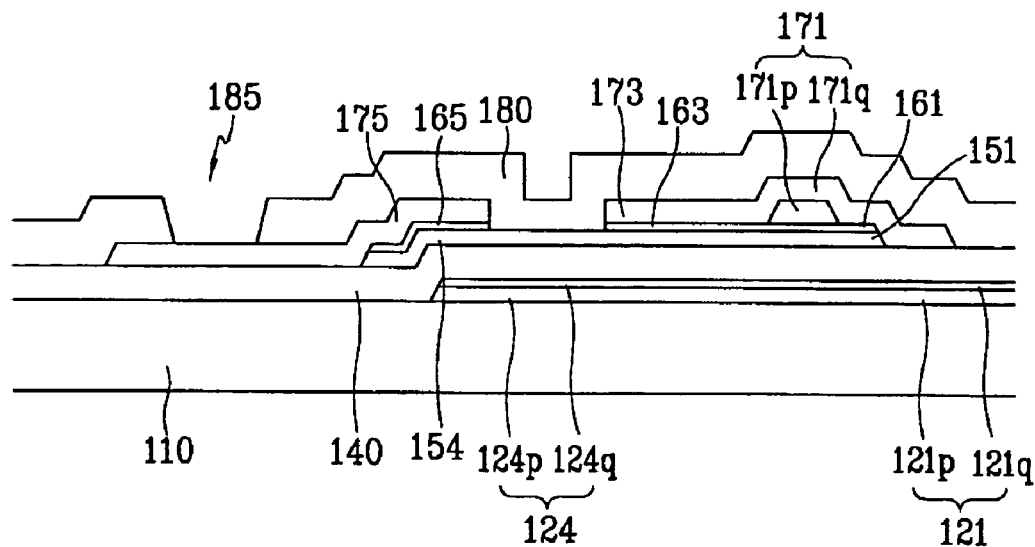
FIGS. 15A and 15B are sectional views of the TFT array panel shown in FIG. 14 taken along the lines XVa-XVa' and XVb-XVb', respectively.
Figure 15B:
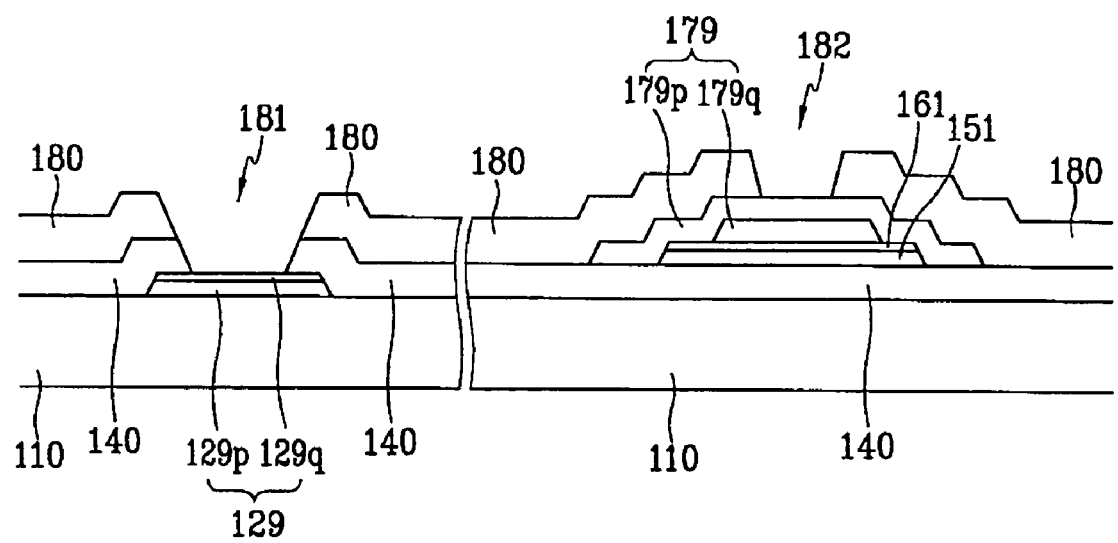

FIG. 3 is a layout view of a TFT array panel shown in FIGS. 1, 2A and 2B in the first step of a manufacturing method thereof according to an embodiment of the present invention; FIGS. 4A and 4B are sectional views of the TFT array panel shown in FIG. 3 taken along the lines IVa-IVa' and IVb-IVb', respectively; FIGS. 5A and 5B are sectional views of the TFT array panel shown in FIG. 3 taken along the lines IVa-IVa' and IVb-IVb', respectively, and illustrate the step following the step shown in FIGS. 4A and 4B; FIG. 6 is a layout view of the TFT array panel in the step following the step shown in FIGS. 5A and 5B; FIGS. 7A and 7B are sectional views of the TFT array panel shown in FIG. 6 taken along the lines VIIa-VIIa' and VIIb-VIIb', respectively; FIGS. 8A and 8B are sectional views of the TFT array panel shown in FIG. 6 taken along the lines VIIa-VIIa' and VIIb-VIIb', respectively, and illustrate the step following the step shown in FIGS. 7A and 7B; FIG. 9 is a layout view of the TFT array panel in the step following the step shown in FIGS. 8A and 8B; FIGS. 10A and 10B are sectional views of the TFT array panel shown in FIG. 9 taken along the lines Xa-Xa' and Xb-Xb', respectively; FIGS. 11A and 11B are sectional views of the TFT array panel shown in FIG. 9 taken along the lines Xa-Xa' and Xb-Xb', respectively, and illustrate the step following the step shown in FIGS. 10A and 10B; FIG. 12 is a layout view of the TFT array panel in the step following the step shown in FIGS. 11A and 11B; FIGS. 13A and 13B are sectional views of the TFT array panel shown in FIG. 12 taken along the lines XIIIa-XIIIa' and XIIIb-XIIIb', respectively; FIG. 14 is a layout view of the TFT array panel in the step following the step shown in FIGS. 12, 13A and 13B; and FIGS. 15A and 15B are sectional views of the TFT array panel shown in FIG. 14 taken along the lines XVa-XIa' and XVb-XVb', respectively.

Referring to FIGS. 3-4B, a plurality of gate lines 121 including gate electrodes 124 are formed by lithography and etch on an insulating substrate 110 such as transparent glass. The gate lines 121 include two conductive films, a lower conductive film 121p preferably made of Al—Nd and having a thickness of about 1,000-3,000 Å, preferably about 2,500 Å and an upper conductive film 121q preferably made of Mo and having a thickness of about 500 Å. The lower and the upper films 121p and 121q can be simultaneously etched with inclined edge profiles by using an Al etchant containing about 8-15% $CH_3COOH$, about 5~8% $HNO_3$, about 50~60% $H_3PO_4$, and remaining $H_2O$. In FIGS. 4A and 4B, the lower and the upper films of the gate electrodes 124 are indicated by reference numerals 124p and 124q, respectively, and the lower and the upper films of the end portions 129 are indicated by reference numerals 129p and 129q, respectively.

Referring to FIGS. 5A and 5B, a gate insulating layer 140, an intrinsic a-Si layer 150, and an extrinsic a-Si layer 160 are sequentially deposited by CVD, and then a lower conductive film 170p is deposited by sputtering. The gate insulating layer 140 is preferably made of silicon nitride with thickness of about 2,000 Å to about 5,000 Å, and the deposition temperature is preferably in a range of about 250-500° C. The intrinsic a-Si layer and the extrinsic a-Si layer have thickness of about 500-1,500 Å and about 500-600 Å, respectively. The lower conductive film 170p is preferably made of Al or Al—Nd and has a thickness of about 1,000-3,000 Å, preferably about 2,500 Å. A sputtering target for the lower conductive film 170p is preferably Al or Al—Nd containing about 2 atomic % of Nd and a sputtering temperature is about 150° C.

Next, a photoresist 50 having a thickness of about one to two microns is coated on the lower conductive film 170p and exposed to light through a photo mask 40 using a light exposer (not shown). The photo mask 40 includes a transparent substrate 41 and an opaque light blocking film 42 and has light blocking areas B covered with portions of the opaque film 42 having a width larger than a predetermined value, light transmitting areas A provided with no opaque film over a predetermined distance, and translucent areas C provided with a plurality of slits 43 or a plurality of portions of the opaque film 42, which have a width smaller than the predetermined value and spaced apart from each other by a distance smaller than the predetermined distance. The predetermined width and the predetermined distance may be equal to a resolution of the light exposer used in this step.

The photoresist 50 is then developed such that first and second portions 52 and 54 of the photoresist 50 (indicated by hatched regions shown in FIGS. 5A and 5B) are remained, while the remaining portions 56 are removed. The second portions 54 have a thickness smaller than the first portions 52, and the thickness ratio of the first and the second portions 52 and 54 can be determined in consideration of following process conditions. However, the thickness of the second portions 54 is preferably smaller than a half of that of the first portions 52, and more preferably, smaller than about 4,000 Å.

Such a position-dependency of the photoresist thickness may be alternatively obtained by providing the translucent areas C with a lattice pattern or a thin film having an intermediate light transmittance or an intermediate thickness. Another example of obtaining a photoresist having a position-dependent thickness is to use reflowable photoresist. In detail, a reflowable photoresist is coated and light-exposed through a normal photo mask having only light blocking areas and light transmitting areas and it is reflowed onto areas that are not covered with the photoresist to form thin portions.

Appropriate process conditions can selectively etch the layers 150, 160 and 170p underlying the photoresist 50, which will be described in detail.

Referring to FIGS. 6, 7A and 7B, the lower conductive film 170p, the extrinsic a-Si layer 160, and the intrinsic a-Si layer 150 are etched using the first and the second portions 52 and 54 of the photoresist 50 as an etch mask to form a plurality of lower conductors 174p, a plurality of extrinsic semiconductor stripes 164, and a plurality of intrinsic semiconductor stripes 151 including projections 154, respectively.

Referring to FIGS. 8A and 8B, the photoresist 50 is etched back by ashing, etc., such that the second portions 54 of the photoresist 50 is completely removed and the first portions 52 experience thickness reduction to be converted into photoresist portions 57. At this time, the width of the photoresist portions 57 may become smaller than that the first portions 152 since the ashing may also remove edge portions of the photoresist 50.

Referring to FIGS. 9, 10A and 10B, the lower conductors 174 are etched using the photoresist portions 57 as an etch mask to form a plurality of lower data lines 171p including end portions 179p and to expose portions of the extrinsic semiconductor stripes 164 particularly disposed on the projections 154 of the intrinsic semiconductor stripes 151.

Referring to FIGS. 11A and 11B, an upper conductive film 170q preferably made of Cr is deposited by sputtering, etc., and another photoresist 70 is formed thereon. The photoresist 70 preferably has a thickness of about one to two microns and may be formed by using a photo mask (not shown) having light blocking areas and light transmitting areas.

Referring to FIGS. 12, 13A and 13B, the upper conductive film 170q is etched by using the photoresist 70 to form a plurality of upper data lines 171q including source electrodes 173 and a plurality of drain electrodes 175 and to expose portions of the extrinsic semiconductor stripes 164 disposed between the source electrodes 173 and the drain electrodes 175. The upper data lines 171q cap the lower data lines 171p.

After removing the photoresist 70, the exposed portions of the extrinsic semiconductor stripes 164 are removed to expose portions of the intrinsic semiconductor stripes 151 by etching the extrinsic semiconductor stripes 164 using the upper data lines 171q and the drain electrodes 175 as an etch mask. Alternatively, the etch of the extrinsic semiconductor stripes 164 can be performed by using the photoresist 70 before being removed. The etch condition for this step is determined so that the gate insulating layer 140 be not etched.

The exposed portions of the intrinsic semiconductor stripes 151 may be subjected to plasma treatment for stabilizing the surface thereof.

Referring to FIGS. 14, 15A and 15B, a passivation layer 180 is deposited and patterned along with the gate insulating layer 140 to form a plurality of contact holes 181, 182, 185 exposing the end portions 129 of the gate lines 121, the end portions 179 of the data lines 171, and the end portions of the drain electrodes 175. Since the upper data lines 171p cap the lower data lines 171p, the contact holes 182 expose only the upper data lines 171p.

Referring to FIGS. 1, 2A and 2B, an ITO layer having a thickness of about 400-500Å is sputtered and photo-etched to form a plurality of pixel electrodes 190 and a plurality of contact assistants 81 and 82. Since the upper data lines 171q and the drain electrodes 175 are made of Cr and the lower data lines 171p made of Al—Nd is capped with the upper data lines 171q, the use of the ITO layer, which is relatively reliable than other transparent conductive material such as IZO, is not restricted.

However, ITO can be substituted with a-ITO or IZO. An example of commercially available sputtering target for IZO is IDIXO (indium x-metal oxide) produced by Idemitsu in Japan. The sputtering target may include $In_2O_3$ and ZnO and the content of Zn among In and Zn preferably ranges about 15-20 atomic %. In addition, the sputtering temperature for Zn is preferably lower than about 250° C. and IZO can be etched by oxalic acid.

The contact assistants 81 and 82 and the pixel electrodes 190 cover the exposed portions of the upper conductors 129q, 179p and 175 made of Cr or Mo containing metal.

The above-described thin film transistor array panel and manufacturing method thereof prevent the disconnection of the data lines 171 since the data lines 171 have dual-layered structure and the upper layer caps the lower layer. In addition, the method may not require strict accuracy of the positions and dimensions for translucent areas of the photo mask for patterning the lower data lines and the underlying layers since the translucent areas are irrelevant of channels of TFTs.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
    forming a gate line on a substrate;
    forming a gate insulating layer;
    forming a semiconductor layer;
    forming a lower data line;
    forming an upper data line including a source electrode and a drain electrode, the upper data line including a portion disposed on the semiconductor layer without interposing the lower data line;
    forming a passivation layer having a first contact hole exposing the drain electrode at least in part; and
    forming a pixel electrode on the first contact hole to contact the drain electrode.

2. The method of claim 1, wherein the upper data line has a contact characteristic with the pixel electrode better than the lower data line.

3. The method of claim 1, wherein the lower data line comprises Al or Al alloy.

4. The method of claim 3, wherein the upper data line comprises Cr, Mo, or Mo alloy.

5. The method of claim 4, wherein the pixel electrode comprises indium tin oxide (ITO) or indium zinc oxide (IZO).

6. The method of claim 1, wherein the upper data line caps the lower data line.

7. The method of claim 6, wherein the source electrode or the drain electrode is formed by the upper data line only.

8. The method of claim 1, further comprising:
    forming an ohmic contact layer on the semiconductor layer.

9. The method of claim 8, wherein the formation of the gate insulating layer, the formation of the semiconductor layer, the formation of the ohmic contact layer, and the formation of the lower data line comprises:
    depositing the gate insulating layer, the semiconductor layer, the ohmic contact layer, and a lower conductive film in sequence;
    forming a first photoresist on the lower conductive film;
    sequentially etching the lower conductive film, the ohmic contact layer, and the semiconductor layer using the first photoresist as an etch mask;
    deforming the first photoresist to form a second photoresist; and
    etching the lower conductive film to form the lower data line.

10. The method of claim 9, wherein the first photoresist has a position-dependent thickness.

11. The method of claim 10, wherein the first photoresist is formed by using a mask having a transparent area, an opaque area, and a translucent area.

12. The method of claim 11, wherein the deformation of the first photoresist comprises:
    ashing the first photoresist.

13. The method of claim 12, wherein the ashing of the first photoresist comprises:
    removing a portion of the first photoresist corresponding to the translucent area of the mask.

14. The method of claim 1, further comprising:
    forming a second contact hole at the passivation layer or the gate insulating layer exposing a portion of the gate line or the data line; and
    forming a contact assistant on the second contact hole to contact the exposed portion of the gate line or the data line.

* * * * *